United States Patent [19]
Hirate

[11] Patent Number: 6,021,460
[45] Date of Patent: Feb. 1, 2000

[54] PROTECT CIRCUIT OF REGISTER

[75] Inventor: Koji Hirate, Tokyo, Japan

[73] Assignee: Mitsubishi Denki Kabushiki Kaisha, Tokyo, Japan

[21] Appl. No.: 09/009,729

[22] Filed: Jan. 21, 1998

[51] Int. Cl.[7] .................................................. G06F 12/00
[52] U.S. Cl. .................... 711/100; 711/143; 711/154; 711/210; 710/52; 365/189.01; 365/189.05
[58] Field of Search .................................. 711/100, 108, 711/109, 155, 154, 156, 143, 210; 365/189.01, 189.05, 189.07, 189.12; 364/238.6, 238.7; 710/260, 52, 54, 130

[56] References Cited

U.S. PATENT DOCUMENTS

| | | | |
|---|---|---|---|
| 4,881,169 | 11/1989 | Tanaka et al. | 714/55 |
| 5,550,993 | 8/1996 | Ehlig et al. | 712/229 |
| 5,802,579 | 9/1998 | Crary | 711/149 |

FOREIGN PATENT DOCUMENTS 2-150943  6/1990  Japan .

*Primary Examiner*—Ayaz R. Sheikh
*Assistant Examiner*—Ario Etienne
*Attorney, Agent, or Firm*—Burns, Doane, Swecker & Mathis, LLP

[57] ABSTRACT

A protect circuit of a register which can positively protect the contents of a register in a runaway of a program in a microcomputer or the like. It includes a first register for holding data on a data bus of a microcomputer at a first time instant, a second register for holding the data on the data bus at a second time instant which is later than the first time instant by a predetermined time interval, a timer for counting a time period from the first time instant, the timer overflowing when it counts a predetermined time period longer than the predetermined time interval, and a controller for updating a register to be protected by moving data in the first register into the register to be protected only when the second register holds, before the timer overflows, the same data as that held in the first register.

4 Claims, 5 Drawing Sheets

PROTECT CIRCUIT OF REGISTER

BACKGROUND OF THE INVENTION

1. Field of the Invention

The present invention relates to a protect circuit of a register for preventing the contents of an important register from being unduly changed owing to changes in an input or output to a port due to noise or to a runaway of a program or the like in a microcomputer, and particularly to a protect circuit of a register which can implement more positive protection by adding to a conventional protect function, which is achieved by only comparing the contents in registers, a protect function using a timer.

2. Description of Related Art

FIG. 6 is a circuit diagram showing a configuration of a conventional protect circuit. In FIG. 6, the reference numeral 1 designates a data bus in a microcomputer, and 2 and 3 each designate an output register consisting of a D flit-flop. The D flip-flop 2 or 3 with its data input terminal D connected to the data bus 1 inputs and holds data "0" or "1" on the data bus 1 when a write signal •w1 or •w2 is applied to its trigger terminal T, and outputs the stored data "0" or "1" from its output terminal Q.

The reference numeral 4 designates an exclusive-NOR circuit which supplies an output gate control terminal X of a clocked inverter 5 with the inverted exclusive OR of the outputs of the output registers 2 and 3. Receiving, at its output gate control terminal X, data "1" from the exclusive-NOR circuit 4 when the output data of the output registers 2 and 3 are identical, the clocked inverter 5 opens to supply a latch 6 with the output data of the output register 2.

The latch 6 consists of inverters 7 and 8 connected in anti-parallel: The input terminal of the inverter 7 and the output terminal of the inverter 8 are connected to the output terminal of the clocked inverter 5, and the output terminal of the inverter 7 and the input terminal of the Lit inverter 8 are connected to a register no shown in FIG. 6. Thus, the latch 6 holds the data fed from the output register 2 through the clocked inverter 5, and supplies the data to the register.

Next, the operation of the conventional circuit will be described.

Let us assume that a program of the microcomputer runs normally, and identical data, for example, data "1" on the data bus 1 is held sequentially by the output registers 2 and 3 in response to the write signals •w1 and •w2 which are sequentially input. In response to the identical data "1" output from the output registers 2 and 3, the exclusive-NOR circuit 4 supplies data "1" to the output gate control terminal X of the clocked inverter 5.

This places the output terminal of the clocked inverter 5 at the open state so that the latch 6 is supplied through the clocked inverter 5 with the data "1" held in the output register 2 and holds the data. The data "1" held in the latch 6 is supplied to the register as register control data to update the contents in that register.

In contrast, when the program of the microcomputer runs away, there appears a state that the output registers 2 and 3, which have held the identical data in the normal case, hold data of different values.

Assuming that data "0" is held in the output register 2 and "1" in the output register 3, the exclusive-NOR circuit 4 outputs data "0" because of different values output from the output registers 2 and 3, and supplies the data to the output gate control terminal X of the clocked inverter 5.

This places the output terminal of the clocked inverter 5 at a closed state so that the data "0" held in the output register 2 is cut off by the clocked inverter 5. Thus, the latch 6 keeps the data "1" having been held in the normal state of the program, thereby supplying the data "1" to the register as the register control data. In this way, the register is protected.

Incidentally, as a prior art relevant to the present invention, Japanese patent application laid-open No. 2-150943/1990 is known.

The conventional protect circuit of the register with the foregoing configuration has a problem of rewriting the contents of the register in spite of the runaway of the program in the case where the time interval between the write signals •w1 and •w2 are rather long and the contents of the output registers 2 and 3 are mistakenly placed at the same value by chance.

SUMMARY OF THE INVENTION

The present invention is implemented to solve the foregoing problem. It is therefore an object of the present invention to provide a protect circuit of a register that can positively protect a register from being updated in case of the runaway of a program in a microcomputer or the like.

According to a first aspect of the present invention, there is provided a protect circuit of a register comprising: a first register for holding data on a data bus of a computer at a first time instant; a second register for holding the data on the data bus at a second time instant, the second time instant is later than the first time instant by a predetermined time interval; a timer for counting a time period from the first time instant, the timer overflowing when it counts a predetermined time period longer than the predetermined time interval; and control means for updating a register to be protected by moving data in the first register into the register to be protected only when the second register captures and holds, before the timer overflows, same data as that held by the first register.

Here, the protect circuit of a register may further comprise interrupt control means for causing, if the timer overflows, an interrupt to the computer to have the computer detect a failure.

The protect circuit of a register may further comprise a third register for holding in advance data used as a safeguard against a malfunction of the computer, and selecting means for selecting the data held in the third register when the timer overflows before the second time instant at which the second register holds the data, and for supplying the selected data to the register to be protected.

DETAILED DESCRIPTION OF THE PREFERRED EMBODIMENTS

The invention will now be described with reference to the accompanying drawings.

EMBODIMENT 1

Figure 1:
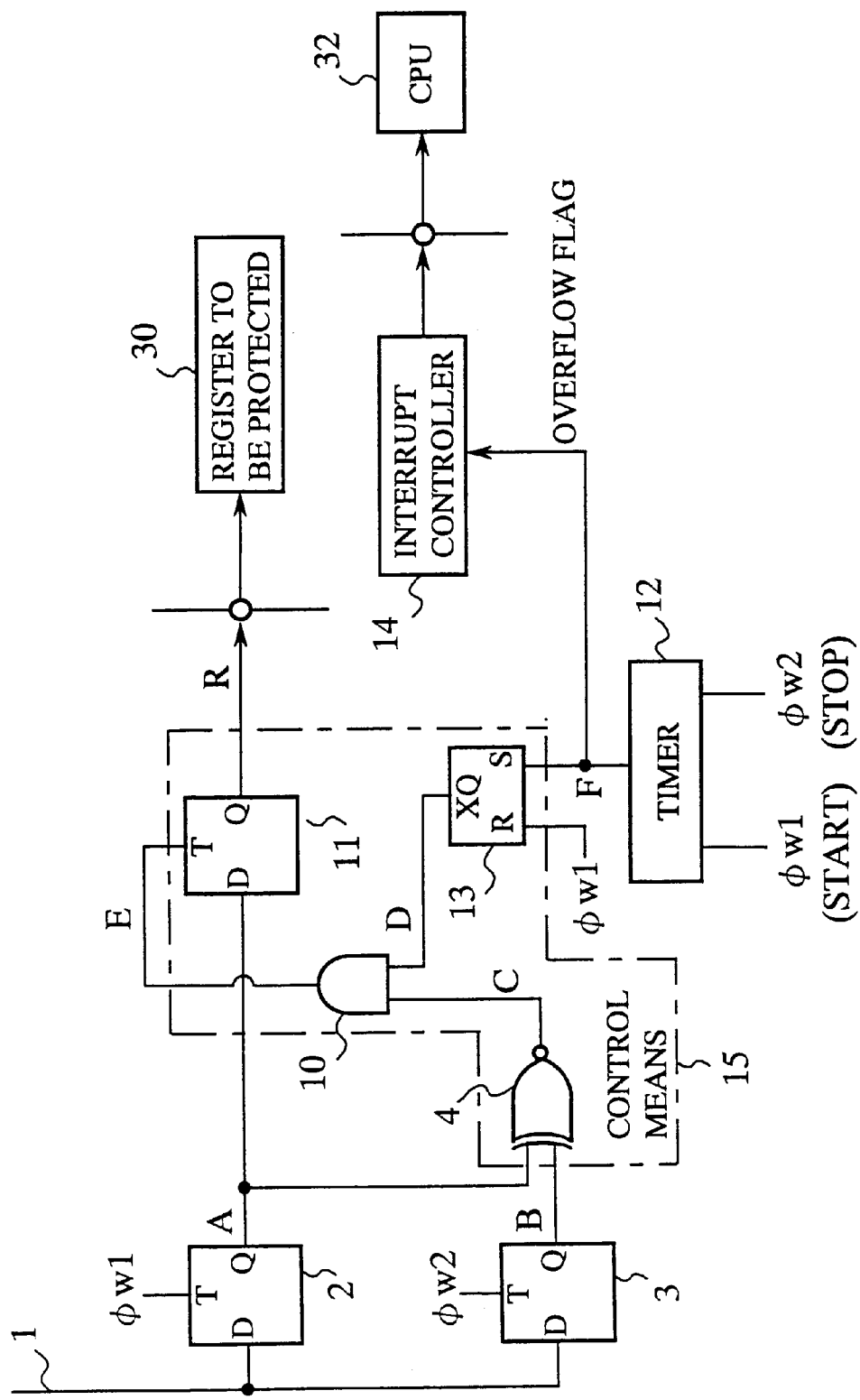
FIG. 1 is a circuit diagram showing an embodiment 1 of a protect circuit of a register in accordance with the present invention.

FIG. 1 is a circuit diagram showing a configuration of an embodiment 1 of a protect circuit of a register in accordance with the present invention. In FIG. 1, the reference numeral 1 designate a data bus in a microcomputer, and 2 and 3 each designate an output register (first and second registers) consisting of a D flip-flop, for example. The output registers 2 and 3, with their data input terminals D connected to the data bus 1, input data "0" or "1" on the data bus 1, capture and hold the data in response to the write signals •w1 and •w2 applied to their trigger terminals T, and output the held data A and B from their output terminals Q.

The reference numeral 4 designate an exclusive-NOR circuit for supplying a two-input AND gate 10 with data C obtained by inverting the exclusive OR of the data A and B output from the output registers 2 and 3. The AND gate 10 ANDs the data C output from the exclusive-NOR circuit 4 and data D output from an S-R flip-flop 13, and supplies the resultant data E to a trigger terminal T of a D flip-flop The D flip-flop 11 holds the output data A of the output register 2 in response to the data E of "1" output from the AND gate 10, and supplies the held data to a register 30 (a register to be protected) as register control data. The reference numeral 12 designates a timer which starts its operation in response to the write signal •w1 and stops it in response to the write signal •w2, and whose set time from the start of its operation to its overflow is placed at a predetermined value longer than an appropriate data write interval to the output registers 2 and 3. When the timer 12 continues counting to the set time and overflows, it sets its overflow flag F to "1".

The S-R flip-flop 13 is reset in response to the write signal •w1, and is set in response to the overflow flag F of "1". so that its output D indicating these states is supplied from its inverted output terminal XQ to the AND gate 10. The reference numeral 14 designates an interrupt controller (interrupt control means) for causing an interrupt to a CPU 32 of the microcomputer when the overflow flag F is placed at "1".

The reference numeral 15 designates a control means consisting of the exclusive-NOR circuit 4, AND gate 10, D flip-flop 11 and S-R flip-flop 13. It allows the contents of the register 30 to be rewritten only when the timer is reset before it overflows, that is, only when the identical data is written in the output register 3 before the timer 12 overflows after the data has been written in the output register 2.

Next, the operation of the present embodiment 1 will be described.

Figure 2:
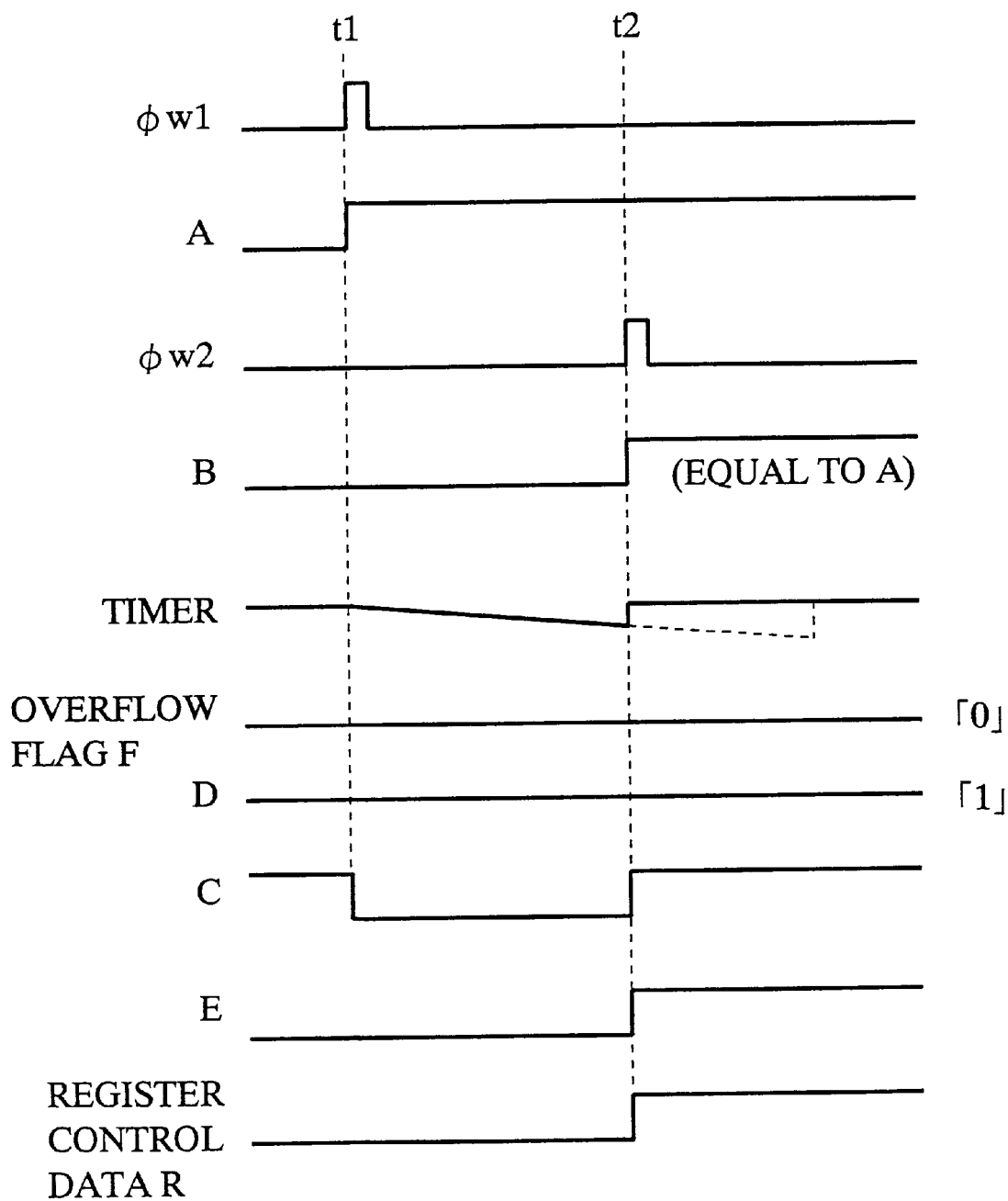
FIG. 2 is a time chart illustrating the operation of the embodiment 1 of the protect circuit of a register in accordance with the present invention.

FIG. 2 is a time chart illustrating the operation of the embodiment 1 of the protect circuit of a register in a normal operation mode of a program of the microcomputer, in which the data identical to that of the output register 2 is written into the output register 3 before the timer 13 overflows after that data has been written in the output register 2.

Assuming that the write signal •w1 of "1" in the form of a pulse is applied to the output register 2 at time t1 in FIG. 2, and the data of "1" on the data bus 1 is held in the output register 2, its output data A becomes "1". This will place the output data A of the output register 2 at a value different from the output data B of the output register 3, and hence the data C output from the exclusive-NOR circuit 4 becomes "0".

At the same time t1, the write signal •w1 is also delivered to the timer 12 and the S-R flip-flop 13. Thus, the timer 12 starts its time count and the S-R flip-flop 13 is reset. This will place the overflow flag F at "0" and the output data D of the S-R flip-flop 13 at "1".

Therefore, the data E output from the AND gate 10 is "0". and hence the value of the data held in the D flip-flop 11 is unchanged.

Subsequently, if the write signal •w2 of "1" in the form of a pulse is applied to the output register 3 at time t2 before the timer 12 overflows, and the data "1" on the data bus 1 is captured and held in the output register 3, its output data B becomes "1". This will make equal the data in the output registers 2 and 3, and hence the data C output from the exclusive-NOR circuit 4 is placed at "1".

At the same time t2, the write signal •w2 is also supplied to the timer 12, and stops its counting operation. In this case, since the timer 12 has not yet overflowed, the overflow flag F is kept "0" and the S-R flip-flop 13 maintains its output data D at "1".

Accordingly, receiving the data C and D which are both "1". the AND gate 10 supplies the D flip-flop 11 with the data E of "1". Thus, the D flip-flop 11 holds the output data A of "1" fed from the output register 2. As a result, the register control data R is changed to "1". and the data "1" is fed to the register 30, thereby updating the data in the register 30.

Next, referring to FIG. 3, the operation of the present embodiment 1 in a runaway mode of the program of the microcomputer will be described, in which case the timer 12 overflows.

Figure 3:
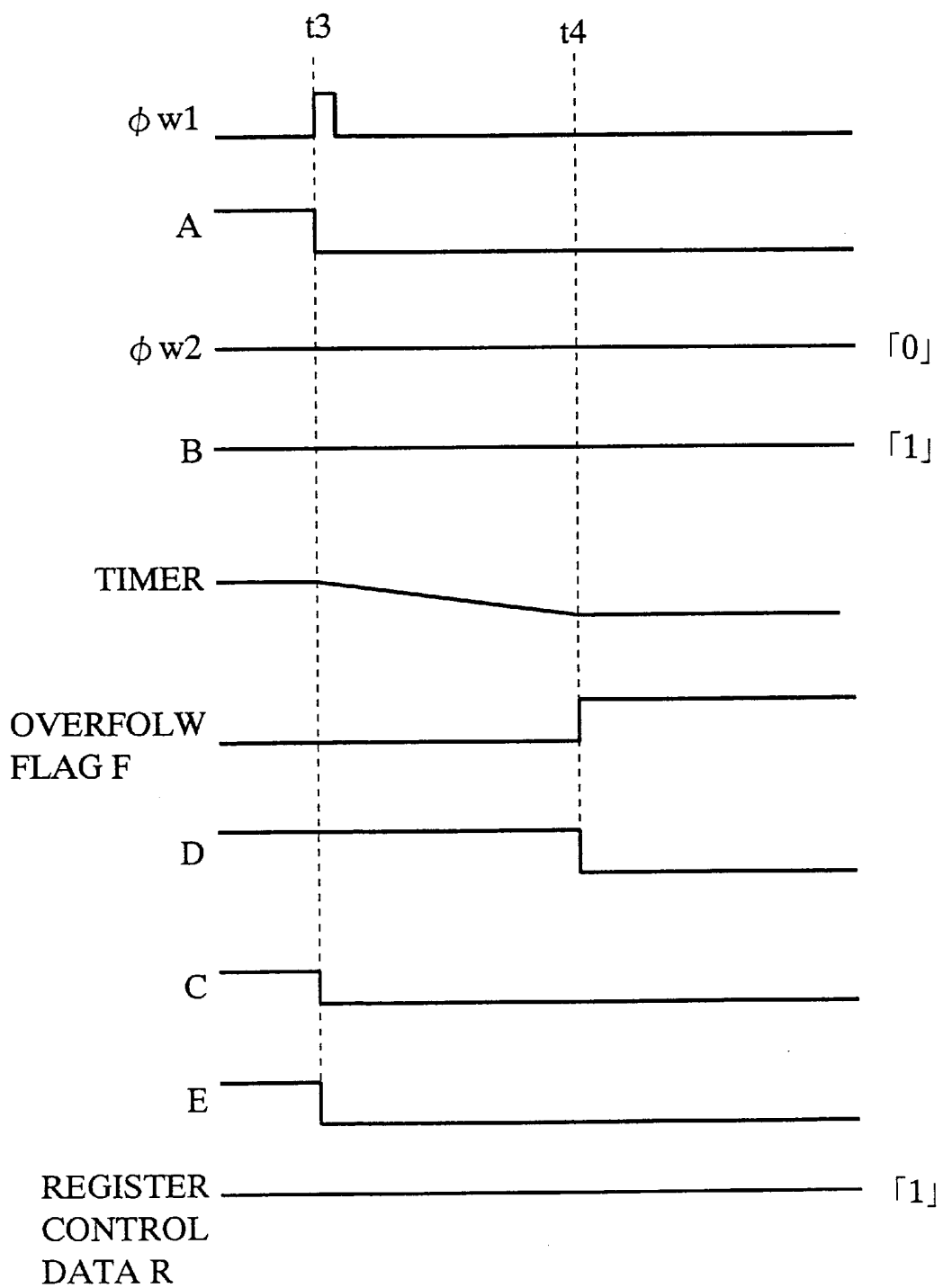
FIG. 3 is another time chart illustrating the operation of the embodiment 1 of the protect circuit of a register in accordance with the present invention.

Assuming that the output register 2 holds the data "0" on the data bus 1 in response to the write signal •w1 applied thereto at time t3 of FIG. 3 after time t2 of FIG. 2, its output data A becomes "0". This will differentiate the output data A of the output register 2 from the output data B of the output register 3, resulting in the data C output from the exclusive-NOR circuit 4 to be placed at "0". Thus, the AND gate 10 outputs the data E of "0". and hence the D flip-flop 11 retains the previous data "1".

At the same time t3, in response to the write signal •w1, the timer 12 starts counting and the S-R flip-flop 13 is reset, in which case the overflow flag F is maintained at "0" and the output data D is maintained at "1".

Subsequently, if the timer 12 overflows at time t4, the overflow flag F becomes "1". This will place the S-R flip-flop 13 at the set state and hence its output data D at "0" which is supplied to the AND gate 10.

Thus, the interrupt controller 14 causes an interrupt to the CPU 32 so that the CPU 32 detects the runaway of the program. The microcomputer can be reset by the overflow flag F.

The AND gate 10, supplied with the data D of "0". keeps its output data E at "0" even if the output register 3 happens to capture and hold the data identical to that of the output register 2. This can prevent the D flip-flop 11 from holding the output data A of the output register 2, and hence the register control data R from being changed, thereby keeping the contents of the register 30.

Thus, the present embodiment 1 comprises the two output registers 2 and 3, the timer 12 whose overflow time from the start of the counting operation to the overflow is set at the predetermined time period longer than the appropriate time interval between the data write timings into the output registers 2 and 3, and the control means 15 which allows the register to rewrite its data only when the data identical to that having been written in the output register 2 is written in the output register 3 before the timer 12 overflows. This offers an advantage of preventing the data in the register to be protected from being unduly updated during the runaway of a program, which can occur in the conventional protect circuit if the two output registers happen to mistakenly hold the same data between the rather long time interval between the writing operations by the write signals •w1 and •w2 during the runaway of the program.

Furthermore, the present embodiment 1 has an advantage that it can cause an interrupt to have the microcomputer detect the program runaway, or to reset the microcomputer.

EMBODIMENT 2

Figure 4:
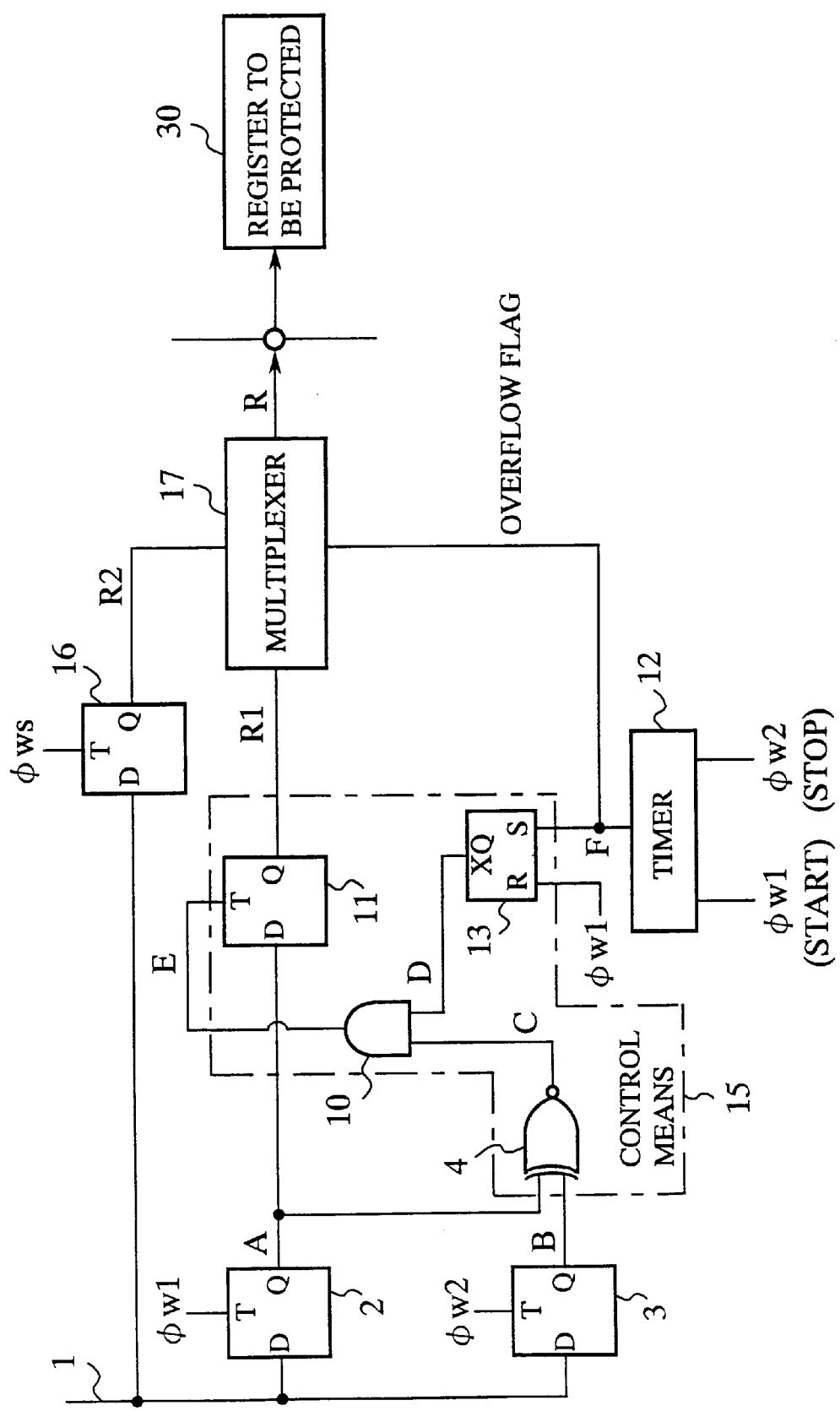
FIG. 4 is a circuit diagram showing an embodiment 2 of the protect circuit of a register in accordance with the present invention.

FIG. 4 is a circuit diagram showing a configuration of an embodiment 2 of the protect circuit of a register in accordance with the present invention, in which the corresponding portions to those of the embodiment 1 as shown in FIG. 1 are designated by the same reference numerals, and the description thereof is omitted here.

In FIG. 4, the reference numeral 16 designates a safeguard register (a third register) consisting of a D flip-flop which captures data "0" or "1" on the data bus 1 and holds it in advance in response to a write signal •wS. The value stored in this register is determined at a value that provides an adequate safeguard against a failure of the system.

The reference numeral 17 designates a multiplexer (selecting means) which selects the data R2 stored in the safeguard register 16 as the register control data R in case where writing of data into the output register 3 has not occurred throughout the time period from the writing of data into the output register 2 to the overflow of the timer 12.

Figure 5:
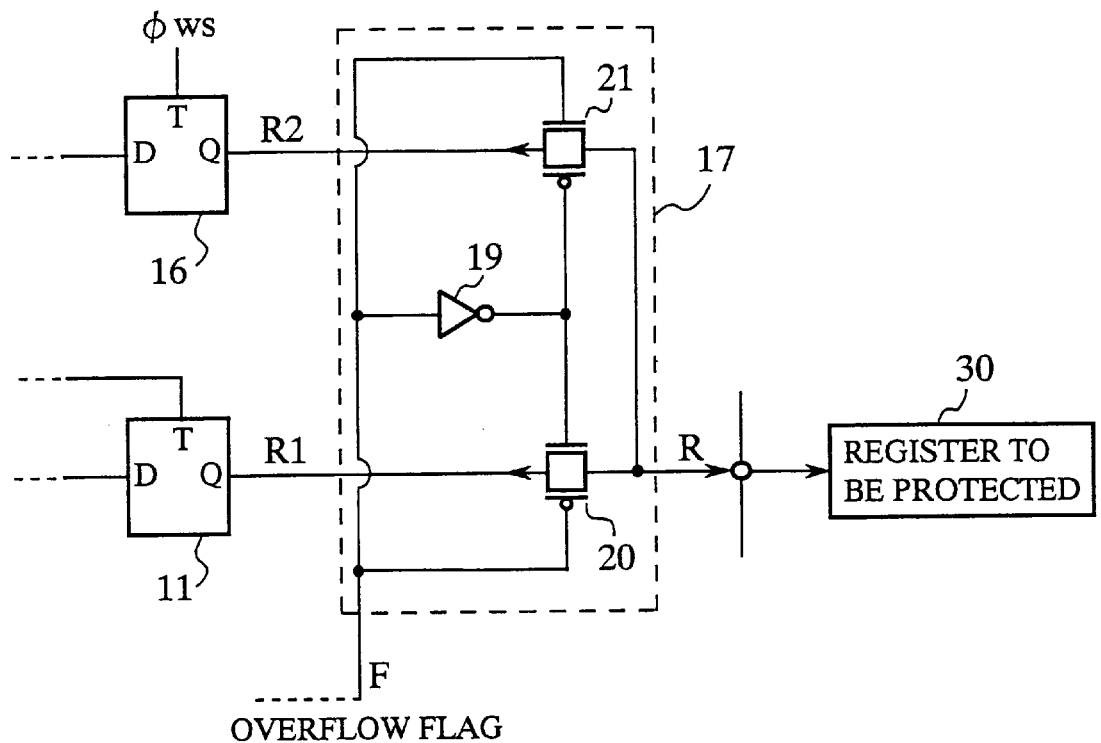
FIG. 5 is a circuit diagram showing a configuration of the multiplexer of FIG. 4.
Figure 6:
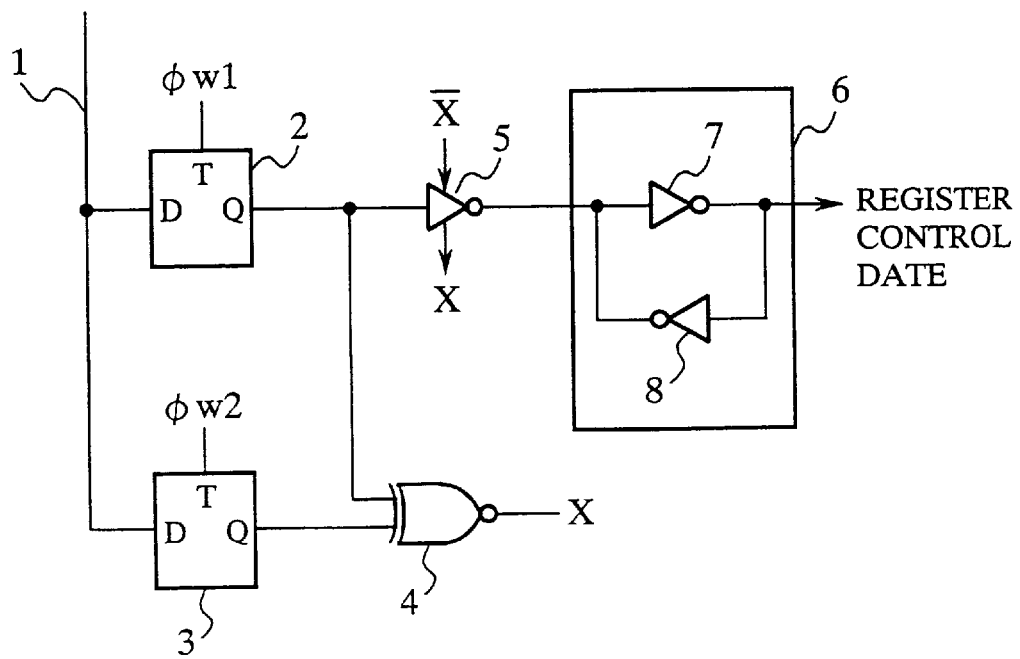
FIG. 6 is a circuit diagram showing a configuration of a conventional protect circuit of a register.

The multiplexer 17 includes an inverter 19, and transmission gates 20 and 21 as shown in FIG. 5, for example. The transmission gate 20 selects the data R1 held in the D flip-flop 11 as the register control data R in response to the overflow flag F of "0" and to its inverted signal "1" output from the inverter 19 before the overflow of the timer 12. In contrast, the transmission gate 21 selects the data R2 held in the safeguard register 16 as the register control data R in response to the overflow flag of "1" and to its inverted signal "0" output from the inverter 19 when the writing of data into the output register 3 has not been carried out until the overflow of the timer 12. The configuration of FIG. 4 can also include the interrupt controller 14 as in FIG. 1.

Next, the operation of the present embodiment 2 will be described.

If the output data A and B of the output registers 2 and 3 coincide at time t2 before the overflow of the timer 12 as shown in FIG. 2, the data R1 held in the D flip-flop 11 is output from the transmission gate 20 as the register control data R because only the transmission gate 20 in the multiplexer 17 is opened in this case owing to the overflow flag F of "0".

On the other hand, if the writing of data into the output register 3 has not been carried out until the timer 12 overflows at time t4 as shown in FIG. 3, the data R2 held in the safeguard register 16 is output from the transmission gate 21 as the register control data R because only the transmission gate 21 in the multiplexer 17 is opened in this case owing to the overflow flag F of "1".

Thus, the present embodiment 2 is configured such that the data R2, which has been written in the safeguard register 16 during the normal operation of the program, is supplied to the register 30 to be protected as the register control data R in a case of program runaway so that safeguard data is written into the register 30 even in the program runaway. This offers an advantage of positively protecting the register 30 to be protected.

Although the registers are each assumed to be one bit in the embodiments above, it is obvious that they may consists of any number of bits.

What is claimed is:

1. A protect circuit of a register comprising:

a first register for holding data on a data bus of a computer at a first time instant;

a second register for holding the data on the data bus at a second time instant, said second time instant is later than said first time instant by a predetermined time interval;

a timer for counting a time period from said first time instant, said timer overflowing when it counts a predetermined time period longer than said predetermined time interval; and control means for updating a register to be protected by moving data in said first register into said register to be protected only when said second register captures and holds, before the timer overflows, same data as that held by said first register.

2. The protect circuit of a register as claimed in claim 1, further comprising interrupt control means for causing, if the timer overflows, an interrupt to the computer to have the computer detect a failure.

3. The protect circuit of a register as claimed in claim 1, further comprising a third register for holding in advance data used as a safeguard against a malfunction of the computer, and selecting means for selecting the data held in the third register when the timer overflows before the second time instant at which the second register holds the data, and for supplying the selected data to the register to be protected.

4. The protect circuit of a register as claimed in claim 2, further comprising a third register for holding in advance data used as a safeguard against a malfunction of the computer, and selecting means for selecting the data held in the third register when the timer overflows before the second time instant at which the second register holds the data, and for supplying the selected data to the register to be protected.

* * * * *

UNITED STATES PATENT AND TRADEMARK OFFICE
CERTIFICATE OF CORRECTION

PATENT NO. : 6,021,460
DATED : February 1, 2000
INVENTOR(S) : K. HIRATE

It is certified that error appears in the above-identified patent and that said Letters Patent is hereby corrected as shown below:

The following information is added:

[30]     Foreign Application Priority Data

August 28, 1997    [JP]    Japan..................... 9-232608

Signed and Sealed this

Eighth Day of May, 2001

*Attest:*

NICHOLAS P. GODICI

*Attesting Officer*    *Acting Director of the United States Patent and Trademark Office*